(12) United States Patent
Gmeinwieser et al.

(10) Patent No.: US 8,900,888 B2
(45) Date of Patent: Dec. 2, 2014

(54) OPTOELECTRONIC SEMICONDUCTOR CHIP AND METHOD FOR PRODUCING AN OPTOELECTRONIC SEMICONDUCTOR CHIP

(75) Inventors: Nikolaus Gmeinwieser, Obertraubling (DE); Berthold Hahn, Hemau (DE)

(73) Assignee: OSRAM Opto Semiconductors GmbH (DE)

( * ) Notice: Subject to any disclaimer, the term of this patent is extended or adjusted under 35 U.S.C. 154(b) by 235 days.

(21) Appl. No.: 13/318,818

(22) PCT Filed: Apr. 8, 2010

(86) PCT No.: PCT/EP2010/054662
§ 371 (c)(1),
(2), (4) Date: Jan. 19, 2012

(87) PCT Pub. No.: WO2010/136251
PCT Pub. Date: Dec. 2, 2010

(65) Prior Publication Data
US 2012/0132945 A1    May 31, 2012

(30) Foreign Application Priority Data
May 29, 2009 (DE) .................. 10 2009 023 351

(51) Int. Cl.
*H01L 21/66* (2006.01)
*G01R 31/26* (2014.01)
*H01L 33/08* (2010.01)
*H01L 33/24* (2010.01)
*H01L 33/22* (2010.01)

(52) U.S. Cl.
CPC ............. *H01L 33/08* (2013.01); *H01L 33/22* (2013.01); *H01L 33/24* (2013.01)
USPC ........................................ 438/16; 257/E33.06

(58) Field of Classification Search
USPC .............................................. 257/98; 438/16
See application file for complete search history.

(56) References Cited

U.S. PATENT DOCUMENTS 6,657,236 B1    12/2003   Thibeault et al.
2005/0051777 A1    3/2005   Hill
(Continued)

FOREIGN PATENT DOCUMENTS

CN    1423842    6/2003
CN    101728462 A    6/2010
(Continued)

OTHER PUBLICATIONS

B. Damilano et al., "Monolithic white light emitting diodes using a {Ga,In}N/GaN multiple quantum well light converter," Applied Physics Letters 93, 101117 (2008), pp. 1-3.
(Continued)

*Primary Examiner* — Asok K Sarkar
*Assistant Examiner* — Igwe U Anya
(74) *Attorney, Agent, or Firm* — DLA Piper LLP (US)

(57) ABSTRACT

An optoelectronic semiconductor chip includes a semiconductor layer sequence. The semiconductor layer sequence contains at least one active layer for generating primary radiation. In addition, the semiconductor layer sequence includes a plurality of conversion layers, the conversion layers being designed to absorb the primary radiation at least partially and to convert it into secondary radiation of a longer wavelength than the primary radiation. Furthermore the semiconductor layer sequence comprises a roughening which extends at least into the conversion layers.

3 Claims, 6 Drawing Sheets

(56) References Cited

U.S. PATENT DOCUMENTS

| | | | |
|---|---|---|---|
| 2006/0258028 A1 | 11/2006 | Paolini et al. | |
| 2007/0221867 A1 | 9/2007 | Beeson et al. | |
| 2009/0101934 A1 | 4/2009 | Massies et al. | |
| 2010/0072500 A1* | 3/2010 | Herrmann | 257/98 |
| 2010/0090232 A1* | 4/2010 | Huang et al. | 257/89 |
| 2010/0283074 A1* | 11/2010 | Kelley et al. | 257/98 |
| 2012/0190141 A1* | 7/2012 | Huang et al. | 438/29 |

FOREIGN PATENT DOCUMENTS

| | | | |
|---|---|---|---|
| CN | 101728462 A | | 6/2010 |
| CN | 1292493 | | 6/2011 |
| JP | 2007-324608 | | 12/2007 |
| JP | 2008-523615 | | 7/2008 |
| KR | 2008013364 A | * | 2/2008 |
| WO | 01/24283 A1 | | 4/2001 |
| WO | 2006/036446 | | 4/2006 |
| WO | 2008/060586 A2 | | 5/2008 |
| WO | 2009/048704 A2 | | 4/2009 |

OTHER PUBLICATIONS

An English translation of Japanese Examination Report dated Jan. 28, 2014 for corresponding Japanese Patent Application No. 2012-512270.

English Translation of corresponding Chinese Office Action dated Dec. 4, 2013.

* cited by examiner

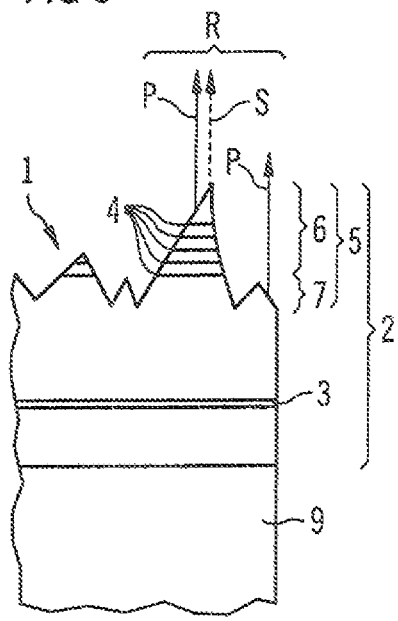
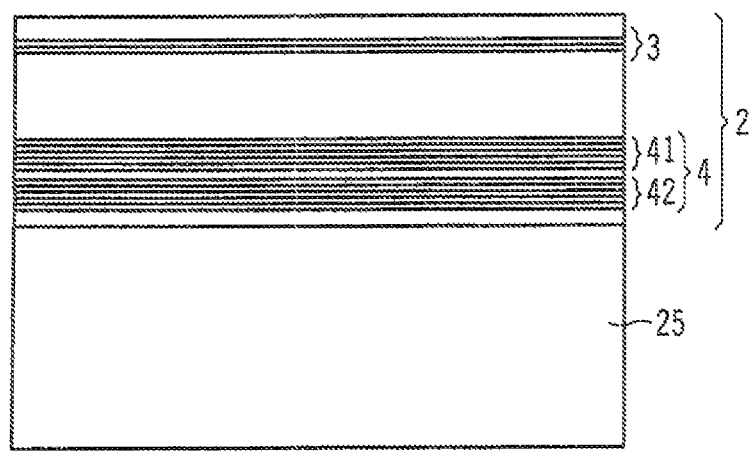

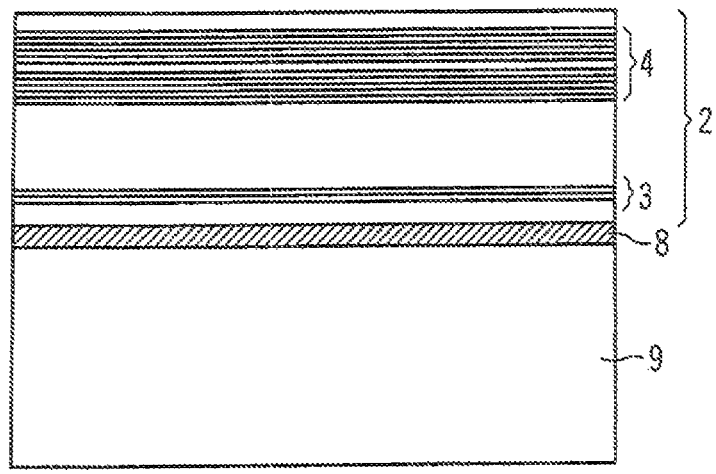
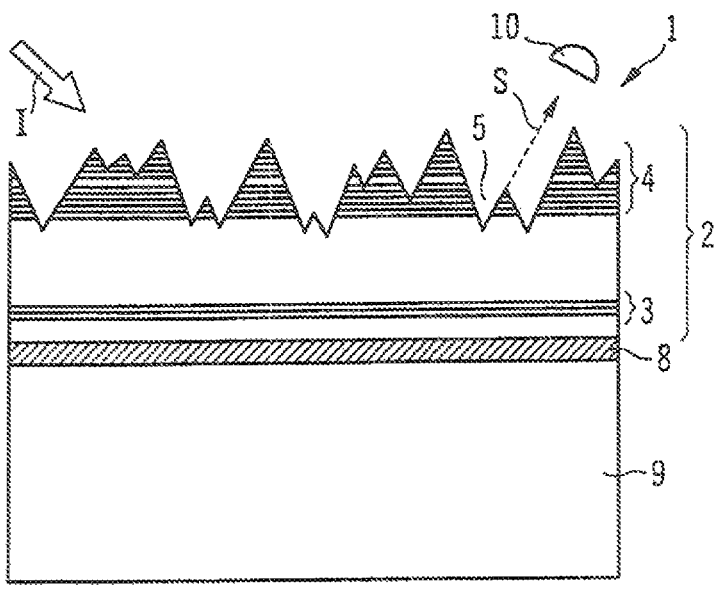

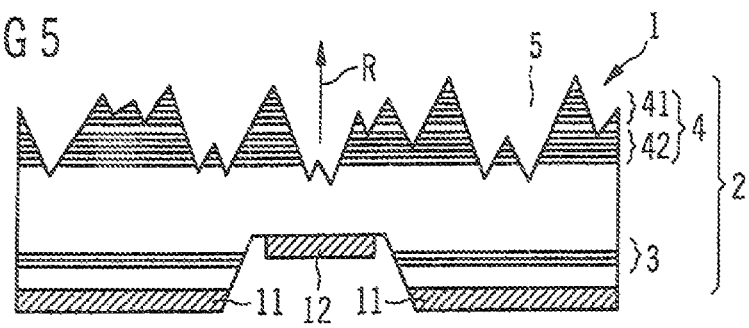
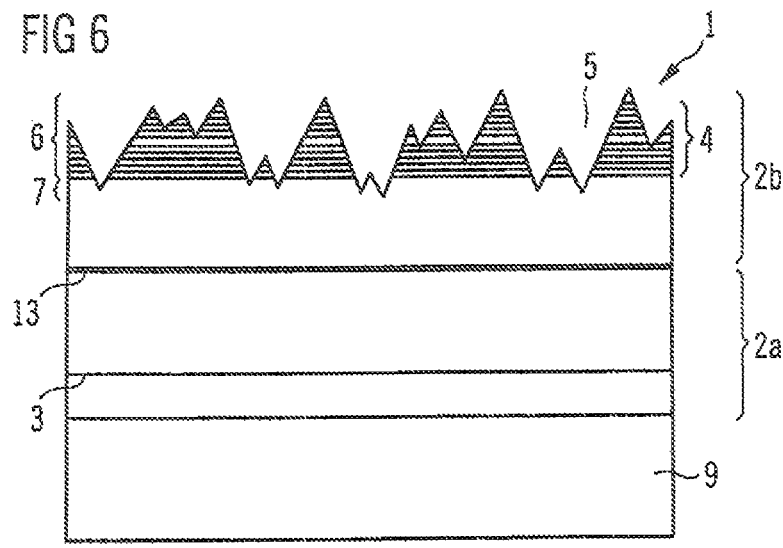
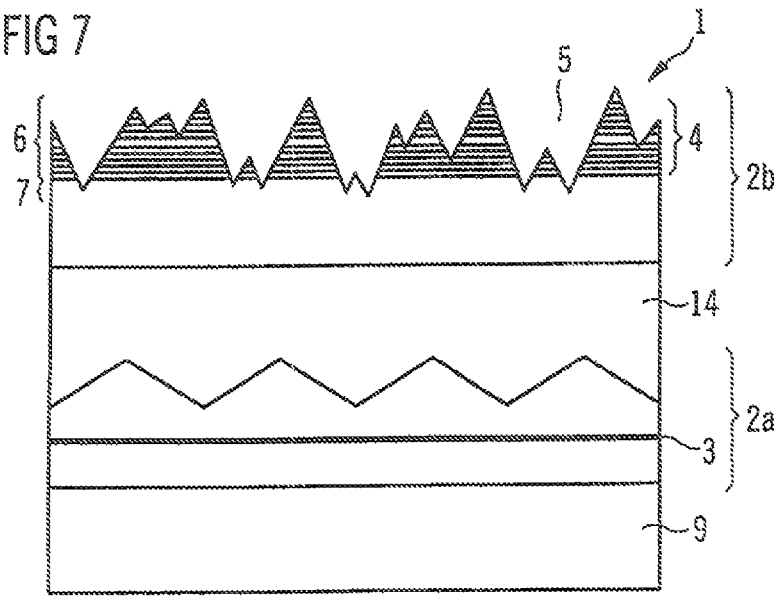

OPTOELECTRONIC SEMICONDUCTOR CHIP AND METHOD FOR PRODUCING AN OPTOELECTRONIC SEMICONDUCTOR CHIP

RELATED APPLICATIONS

This is a §371 of International Application No. PCT/EP2010/054662, with an international filing date of Apr. 8, 2010 (WO 2010/136251, published Dec. 2, 2010), which is based on German Patent Application No. 10 2009 023 351.2, filed May 29, 2009, the subject matter of which is incorporated by reference.

TECHNICAL FIELD

This disclosure relates to an optoelectronic semiconductor chip and a method for producing an optoelectronic semiconductor chip.

BACKGROUND

US 2007/0221867 A1 provides a wavelength conversion chip. It could nonetheless be helpful to provide an optoelectronic semiconductor chip in which a color location of radiation to be emitted may be efficiently adjusted and to provide a method for producing such a semiconductor chip.

SUMMARY

We provide an optoelectronic semiconductor chip having a semiconductor layer sequence which includes at least one active layer that generates primary radiation, one or a plurality of conversion layers which at least partially absorb the primary radiation and convert it into secondary radiation of a longer wavelength than the primary radiation, and a roughened portion which extends at least into the conversion layer or into one of the conversion layers.

We also provide a method for producing an optoelectronic semiconductor chip including providing a growth substrate, growing a semiconductor layer sequence epitaxially on the growth substrate, the semiconductor layer sequence including at least one active layer that generates primary radiation and one conversion layer or a plurality of conversion layers which at least in part absorb the primary radiation and convert it into secondary radiation of a longer wavelength than the primary radiation, forming a roughened portion which extends at least into one of the conversion layers, the material of at least one conversion layer being removed in places by roughening, and completing the semiconductor chip, wherein a color location of radiation emitted by the semiconductor chip is altered by the roughening.

We further provide an optoelectronic semiconductor chip having a semiconductor layer sequence which includes at least one active layer that generates primary radiation, one or a plurality of conversion layers which at least partially absorb the primary radiation and convert it into secondary radiation of a longer wavelength than the primary radiation, and a roughened portion which extends at least into the conversion layer or into one of the conversion layers, wherein the roughened portion passes in places completely through the conversion layers and towards the at least one active layer, radiation emitted at peak regions of the roughened portion remote from the at least one active layer has a different color location than radiation emitted at valley regions of the roughened portion facing an active layer, and the at least one active layer and the conversion layers are monolithically integrated.

BRIEF DESCRIPTION OF THE DRAWINGS

FIG. 3 is a schematic sectional representation of a further example of an optoelectronic semiconductor chip described herein.

FIG. 4 is a schematic representation of a method described herein for producing an optoelectronic semiconductor chip described herein.

FIGS. 5 to 11 are schematic representations of further examples of optoelectronic semiconductor chips described herein.

DETAILED DESCRIPTION

Figure 1:
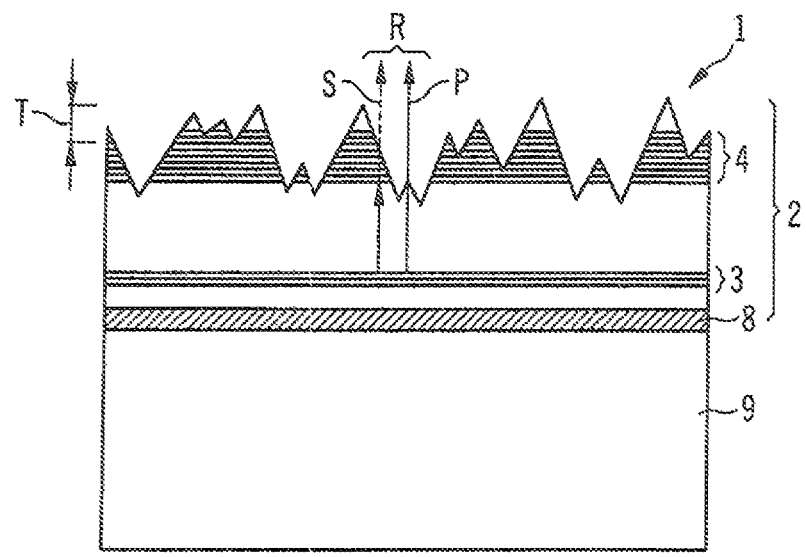
FIGS. 1 and 2, respectively, show a schematic sectional representation (FIG. 1) and a schematic plan view (FIG. 2) of an example of an optoelectronic semiconductor chip described herein.

The optoelectronic semiconductor chip may comprise at least one semiconductor layer sequence. The semiconductor layer sequence is grown epitaxially, for example. For example, the semiconductor layer sequence is based on GaN, InGaN, InGaAlN, GaP, InGaAlP, InGaAs or GaAs. The semiconductor layer sequence preferably takes the form of a thin film layer sequence. In other words, the thickness of the semiconductor layer sequence is preferably less than or equal to 12 µm, in particular less than or equal to 8 µm.

The semiconductor layer sequence may contain at least one active layer. The active layer is designed to generate electromagnetic primary radiation. The layer preferably contains at least one quantum well structure, preferably a plurality of quantum well structures. For example, the active layer is a multi-quantum well structure, MQW for short. The primary radiation preferably exhibits wavelengths in the ultraviolet and/or blue spectral range or indeed in the blue-green or green spectral range.

The semiconductor layer sequence may comprise at least one conversion layer, preferably a plurality of conversion layers. The conversion layers thus consist, in particular, of a semiconductor material. The conversion layers formed, for example, of at least one quantum well structure are designed to absorb the primary radiation completely or partially and convert the absorbed primary radiation into secondary radiation of a longer wavelength than the primary radiation. The conversion layers are preferably arranged downstream of the at least one active layer in an emission direction. The conversion layers are thus electrically inactive, i.e., the conversion layers are not pumped electrically but rather optically.

The semiconductor layer sequence may be subjected to roughening. A roughened portion is formed, for example, of a plurality of trenches. In other words, the roughening may comprise thickness modulation of the semiconductor layer sequence. Roughening may be produced by a photolithographic process and/or by etching. Roughening may be of a regular or indeed random structure.

The roughened portion may extend at least into the conversion layer or into at least one of the conversion layers. In other words, the roughened portion is formed by localized reduction of the thickness of the semiconductor layer sequence. Roughening results in the removal of material from at least one of the conversion layers, i.e., a plurality of trenches or grooves are, for example, preferably formed on a top of the semiconductor layer sequence remote from the active layer, the trenches or grooves extending so far into the semiconductor layer sequence that the material of the conversion layers is partially removed. Trenches or grooves are formed, for example, by removing cross-sectionally V-shaped portions of material from the semiconductor layer sequence. Roughening may also be formed by raised portions which rise above the semiconductor layer sequence, the raised portions preferably including at least some of the conversion layers. Roughening in particular does not extend as far as or into the active layer. In other words, the at least one active layer is not affected by roughening.

The optoelectronic semiconductor chip may comprise a semiconductor layer sequence. The semiconductor layer sequence contains at least one active layer that generates primary radiation. In addition, the semiconductor layer sequence comprises one or more conversion layers, the conversion layers being designed to absorb the primary radiation at least partially and to convert it into secondary radiation of a longer wavelength than the primary radiation. Furthermore, the semiconductor layer sequence comprises a roughened portion, by which a material of the conversion layer or at least one of the conversion layers is removed in part.

Roughening thus constitutes, in particular, purposeful removal of conversion layer material. By adjusting the removal of conversion layer material, i.e., for example, by determining the average depth of the roughening, it is, for example, also possible to determine how large a proportion of primary radiation leaves the semiconductor layer sequence without being absorbed by the conversion layers and converted into the secondary radiation. In other words, a color location (also referred to as "chromaticity coordinate") of mixed radiation emitted by the semiconductor chip may be efficiently adjusted by way the average depth of roughening. Roughening thus makes it possible to adjust the proportion of the secondary radiation in the total radiation emitted by the semiconductor chip by changing the proportion of the conversion layers not affected by the roughening.

The roughening passes in places completely through the conversion layers towards the at least one active layer. In other words, the roughened portion comprises at least one recess which passes through the conversion layers towards the at least one active layer to such an extent that no conversion layer or no part of a conversion layer remains between the active layer and the deepest point of the trench, i.e., the conversion layers are removed completely in places, when the optoelectronic semiconductor chip is viewed in plan view.

The semiconductor layer sequence may comprise at least two groups of differently configured conversion layers. Within a group of conversion layers the conversion layers are each identically configured within the bounds of manufacturing tolerances such that the conversion layers of the groups, for example, each emit secondary radiation of the same wavelength.

The groups may be configured to generate the secondary radiation in at least two different spectral ranges. In other words, secondary radiation of a first wavelength is emitted by one of the groups and secondary radiation of a second wavelength different from the first is emitted by a second one of the groups of conversion layers. For example, one of the groups of conversion layers emits in the green spectral range and a further one of the groups emits in the yellow spectral range. It is furthermore possible for the semiconductor layer sequence to comprise a plurality of groups, for example, precisely three groups, wherein one group of the conversion layers generates electromagnetic secondary radiation from the primary radiation in the green spectral range around 550 nm, preferably one group in the yellow spectral range around 570 nm and in particular one group in the red spectral range around 610 nm.

By using at least two groups of conversion layers an optoelectronic semiconductor chip may be constructed whose radiation exhibits a high color reproduction index, for example, a Color Rendering Index, CRI for short, of at least 85.

The semiconductor chip may emit mixed radiation when in operation, which is formed from both the primary and secondary radiation. The primary radiation is here preferably formed at least in part by blue light.

The optoelectronic semiconductor chip may be designed to emit white light. The color temperature of the white light emitted by the semiconductor chip is preferably between 2500 K and 6000 K, in particular between 2750 K and 4000 K.

The semiconductor layer sequence may comprise 1 to 150 conversion layers, preferably 10 to 50 conversion layers, in particular 20 to 35 conversion layers. The conversion layers take the form, for example, of multi-quantum wells. The conversion layers are, for example, based on the GaN/InGaN material system. If a plurality of conversion layers are present, their thickness preferably amounts to 2 nm to 8 nm. Each of the conversion layers absorbs, for example, 3% to 10% of the primary radiation arriving at the relevant conversion layer. If the semiconductor chip comprises precisely one conversion layer, the thickness thereof amounts preferably to at least 10 nm, in particular to at least 14 nm.

The roughened portion may be formed completely or partially by raised portions, for example, in the form of pyramids and/or in the form of truncated pyramids. In other words, the top, remote from the active layer, of the semiconductor chip is patterned in the manner of an egg box, protruding parts of the semiconductor layer sequence being shaped as pyramids or truncated pyramids.

The pyramids or the truncated pyramids constituting the roughened portion may be hexagonal. The roughened portion is thus preferably formed of hexagonal pyramids or truncated pyramids.

The roughened portion may comprise peak regions and valley regions. The peak regions are those areas of the roughening furthest away from the active layer, and the valley regions are nearest to the at least one active layer. The peak and valley regions may adjoin one another directly in a direction perpendicular to the at least one active layer. For example, the peak regions of the roughened portion are formed by those regions whose depth of penetration into the semiconductor layer sequence corresponds to at most 30% or at most 60% of the average depth of the roughening.

Radiation may be emitted in the peak regions which has a different color location from that emitted in the valley regions. The radiation emitted in the peak regions preferably comprises a smaller blue fraction than the radiation emitted in the valley regions.

Radiation of in each case an approximately comparable color location may be emitted throughout the peak regions of the roughened portion and throughout the valley regions of the roughened portion. For example, yellow-white light is emitted in the peak regions and blue light in the valley regions. The division between peak and valley regions with regard to their distance from the at least one active layer may thus be associated with the respective emitted light spectrum. The valley and peak regions are then distinguishable, for example, by light microscopy or by near field microscopy.

The average depth of the roughened portion is 0.2 µm to 3.5 µm, preferably 0.5 µm to 1.5 µm. The average depth is, for example, measured from the highest point of the roughened portion or from the original top of the semiconductor layer sequence.

A method for producing such an optoelectronic semiconductor chip is additionally provided. For example, the method may be used to produce a semiconductor chip as described in relation to one or more of the above-stated examples. Features of the optoelectronic semiconductor chip are therefore also disclosed for the method described herein and vice versa.

The method may comprise:

providing a growth substrate;

growing a semiconductor layer sequence epitaxially on the growth substrate, the semiconductor layer sequence comprising at least one active layer that generates primary radiation and one or preferably more conversion layers which absorb the primary radiation at least temporarily and convert it into secondary radiation of a longer wavelength than the primary radiation;

forming a roughened portion, in particular on a side of the semiconductor layer sequence facing the conversion layers, the roughened portion extending at least into the conversion layer or into one of the conversion layers such that the material of at least one conversion layer is partially removed; and completing the semiconductor chip, a color location of radiation emitted by the semiconductor chip being altered by roughening.

In other words, the semiconductor layer sequence is grown complete with the conversion layers. The color location is then adjusted by roughening. The deeper the roughening, the more the color location of the radiation emitted by the semiconductor chip is shifted, for example, towards blue.

The semiconductor chip may emit radiation at least from time to time during roughening. Furthermore, the color location of the radiation emitted by the semiconductor chip is measured, likewise at least from time to time during roughening. Thus, during roughening the conversion layers are, for example, irradiated using a light source with a defined wavelength, preferably in the ultraviolet or blue spectral range. The longer wavelength light emitted by the conversion layers is then detected for instance by a spectrometer and the color location of the radiation is determined.

The in each case current color location of the radiation, forming the basis of the roughening present during measuring and then emitted by the completed semiconductor chip, may be determined in this way. In particular, the process of bringing about roughening may be terminated once the color location to be set has been achieved. Roughening may in this way be adjusted purposefully and efficiently to a specific, desired color location of the radiation to be emitted by the semiconductor chip. The color location of the radiation may thus be adjusted largely independently of manufacturing tolerances of the active layer and the conversion layers.

The sum of a $c_x$ value and $c_y$ value of the color location of the radiation emitted by the semiconductor chip may vary in the CIE standard chromaticity diagram by at least 0.005 units, preferably by at least 0.05 units, in particular by at least 0.07 units during roughening. In other words, the sum of the red coordinates and the green coordinates of the color location of the radiation in the CIE standard chromaticity diagram is reduced by the stated value, i.e., the radiation emitted by the semiconductor chip becomes bluer or, with regard to color temperature, cooler, during roughening. A change of this magnitude in the sum of the red and the green color coordinates in the CIE standard chromaticity diagram ensures that, even with relatively large manufacturing tolerances with regard to the active layer and the conversion layers, a desired color location of the radiation to be emitted may be set.

The total semiconductor layer sequence may be grown continuously on the growth substrate. The semiconductor layer sequence is then thus formed by a single layer sequence grown as a whole, which is produced, for example, in a single epitaxy installation and which comprises both the at least one active layer and the conversion layers.

The growth substrate may be removed from the semiconductor layer sequence before roughening. For example, prior to roughening, the semiconductor layer sequence is rebonded onto a carrier substrate which provides mechanical support for the semiconductor layer sequence.

The semiconductor chip may be electrically contacted before roughening. In other words, the at least one active layer of the semiconductor layer sequence is electrically operable before and/or during the roughening process.

The semiconductor chip may be operated electrically at least from time to time during roughening. The radiation emitted by the semiconductor chip may then be measured and the depth of the roughening may be adjusted precisely with regard to a desired color location of the radiation to be emitted.

The at least one active layer and the conversion layers may be grown epitaxially independently of one another in separate semiconductor layer sequences. The two semiconductor layer sequences with the at least one active layer and the conversion layers are then joined firmly together mechanically, for example, by wafer bonding or by a connecting means.

The at least one active layer and the conversion layers may be integrated monolithically into a single semiconductor layer sequence. Monolithically may mean that the entire semiconductor layer sequence is grown epitaxially and that the semiconductor layer sequence is free of any connecting means, or that the semiconductor layer sequence is formed from two or more partial layer sequences by bonding without connecting means.

The entire semiconductor layer sequence may be based on the same semiconductor material, for example, on GaN. This allows better heat dissipation from the conversion layers. In addition, the optical refractive index does not then display any relatively large jumps in the semiconductor layer sequence such that efficient optical coupling may be achieved, in particular between the active layer and the conversion layer. Moreover, temperature sensitivity is identical or virtually identical in the active layer and in the conversion layer. Furthermore, "color fringing" may be suppressed in the optical far field, i.e., the radiation emitted by the semiconductor chip exhibits no or substantially no angle dependence with regard to a color location.

An optoelectronic semiconductor chip described herein and a method described herein will be explained in greater detail below with reference to the drawings and with the aid of examples. Elements which are the same in the individual figures are indicated with the same reference numerals. The relationships between the elements are not shown to scale, however, but rather individual elements may be shown exaggeratedly large to assist in understanding.

FIG. 1 shows a first example of a semiconductor chip 1. A mirror 8 is mounted on a carrier 9. The mirror 8 may be a metallic mirror or indeed a combined dielectric and metallic mirror. On a side of the mirror 8 remote from the carrier 9 there is located a semiconductor layer sequence 2. The semiconductor layer sequence 2, which may, for example, have been grown epitaxially, comprises at least one active layer 3, which is designed to generate primary radiation P with a wavelength preferably in the blue spectral range or in the ultraviolet spectral range.

On a side of the semiconductor layer sequence 2 remote from the carrier there are further located a plurality of conversion layers 4 in the semiconductor layer sequence 2. The conversion layers 4 absorb at least some of the primary radiation P and convert this into secondary radiation S, the secondary radiation S having a larger wavelength than the primary radiation P. On a side of the conversion layers 4 remote from the carrier 9 there is located a further material of the semiconductor layer sequence 2, which may serve, for example, for current distribution and/or for supplying current to the active layer 3. To simplify the illustration, the electrical contacts of the semiconductor chip 1 are not shown in FIG. 1.

Roughening to form roughened portion 5 is brought about from a side of the semiconductor layer sequence 2 remote from the carrier 9. The roughened portion 5 is formed, for example, by a plurality of trenches which locally reduce the thickness of the semiconductor layer sequence 2. The average depth T of the roughened portion 5, measured from the deepest point of the roughened portion 5, amounts, for example, to 0.2 µm to 3.5 µm. The trenches of the roughening pass in places completely through the conversion layers 4, such that no conversion layers 4 remain between the areas of the roughened portion 5 closest to the carrier 9 and the active layer 3.

The primary radiation P and the secondary radiation S mix together to form mixed radiation R. The mixed radiation R is formed by white light, for example. In particular, the proportion of primary radiation P converted into the secondary radiation S may be adjusted by the average depth T of roughening. A color location of the mixed radiation R is thus also adjustable by the average depth of the roughening T.

Figure 2:
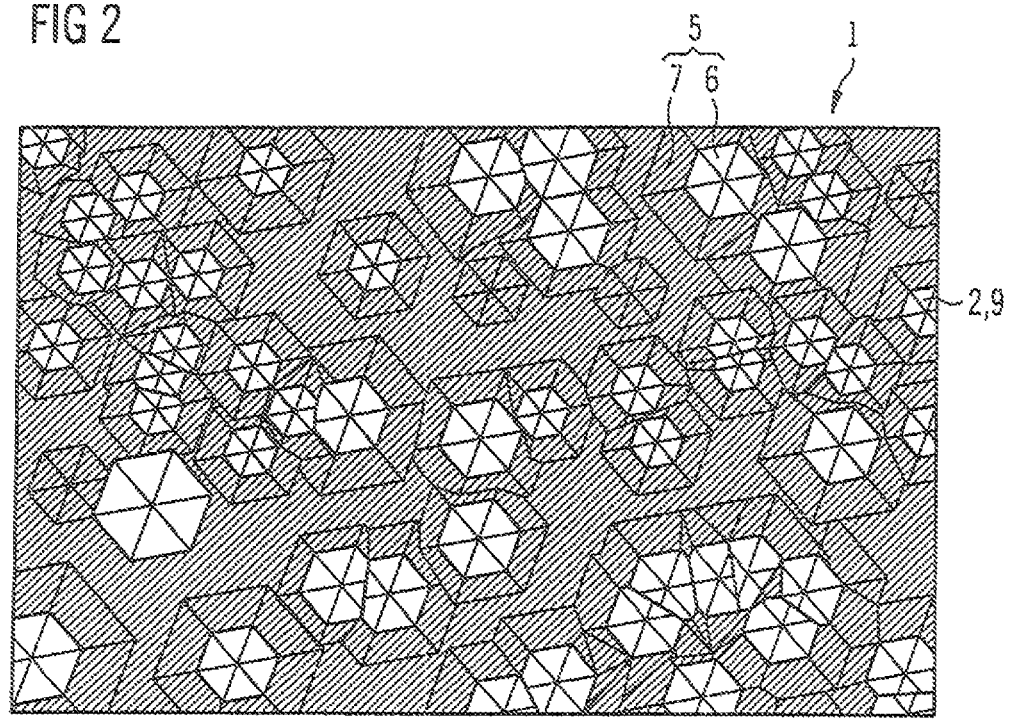

FIG. 2 shows a plan view of the semiconductor chip 1. The semiconductor chip 1 is constructed as shown in FIG. 1, for example. The roughened portion is formed by hexagonal pyramids. The plan view reveals light areas and dark areas of the roughening. The light areas are formed by peak regions 6 of the roughening and the dark areas by valley regions 7 of the roughening, cf. also FIG. 3. The peak regions 6 are those areas of the roughening which are further away from the at least one active layer 3 than the valley regions 7. In other words, the peak regions 6 extend from the conversion layers 4 with which the peak regions 6 are to be associated as far as a side of the semiconductor layer sequence 2 remote from the carrier 9. According to FIG. 3 the valley regions 7 do not include any of the conversion layers 4.

Furthermore, the peak regions 6 and the valley regions 7 differ, in particular, in terms of a color location of the respective emitted radiation. The peak regions 6 and the valley regions 7 may thus then be distinguished from one another by the spectral emission characteristics thereof FIG. 4 is a schematic representation of a method for producing an optoelectronic semiconductor chip 1 described herein. The semiconductor layer sequence 2 is grown epitaxially on a growth substrate 25. A first group 42 and a second group 41 of the conversion layers 4 are grown in a direction away from the growth substrate 25. The at least one active layer 3 is then produced epitaxially. Groups 41, 42 each at least in part absorb the primary radiation generated in the active layer 3. The second group 41 then emits, for example, green light and the first group 42 yellow light, in each case produced from the primary radiation P.

According to FIG. 4B the semiconductor layer sequence 2 is rebonded onto a carrier 9, the, for example, metallic mirror 8 being located between the semiconductor layer sequence 2 and the carrier 9.

According to FIG. 4C the roughened portion 5 is brought about, for example, by etching. During creation of the roughened portion 5 the conversion layers 4 are irradiated with an illuminating radiation I, at least from time to time. The conversion layers are excited by way of the radiation I to generate a secondary radiation S. The secondary radiation S is then detected by a detector 10, for example, a spectrometer. The color location of the radiation emitted by the finished semiconductor chip 1 may then be determined from the spectrum of the secondary radiation S. The roughened portion 5 may thus be adjusted purposefully in such a way that the finished semiconductor chip 1 emits radiation with a specific color location. The color location of the secondary radiation S emitted by the semiconductor chip 1 thus changes during creation of the roughening.

The roughened portion 5 is brought about wet-chemically, for example, in particular without the assistance of masks, pyramid structures preferably arising. Alternatively it is possible for the roughened portion 5 to be produced by photolithographic introduction of recesses. This proceeds, for example, by dry-chemical etching in conjunction with a coating material or a hard mask, for instance, of $SiO_2$, not shown in the Figures. Individual pattern elements of the roughened portion 5 may be arranged, for instance, in a hexagonal grid and may, in particular, exhibit an average diameter of 1 µm to 10 µm and a grid spacing of, for example, 1 µm to 10 µm.

The color location of the mixed radiation R emitted by the semiconductor chip 1 may then be achieved by different etching depths and thus the removal of different amounts of material from the conversion layers 4. The dry-chemical step may additionally be followed by a wet-chemical step, by which the pattern elements produced by the dry-chemical etching may, in particular, be enlarged laterally. The color location of the mixed radiation R to be emitted by the semiconductor chip 1 may be checked, for example, by electrical operation of the semiconductor chip 1 between the various etching steps.

As with all the other examples, it is not necessary for the roughened portion 5, which extends right into at least one of the conversion layers 4, also to bring about a significant improvement in outcoupling of the mixed radiation R from the semiconductor chip 1. The flanks of the roughened portion 5 may thus also be comparatively steep and exhibit angles, relative to a direction of growth of the semiconductor layer sequence 2, which are, for example, between 0° and 20° inclusive. In other words, lateral boundary surfaces of the roughened portion 5 are then oriented parallel or virtually parallel to the direction of growth. This may, in particular, be the case if the roughened portion 5 is produced dry-chemically.

In the case of the semiconductor chip 1 according to FIG. 5, electrical contacts 11, 12 are located on the bottom of the semiconductor layer sequence 2 remote from the roughened portion 5. The electrical contacts 11, 12 are produced, for example, before removal of the growth substrate 25 according to FIGS. 4A and 4B. This makes it possible for the semiconductor chip 1 to be electrically operable even before the roughened portion 5 is brought about. During creation of the roughened portion 5 the semiconductor chip 1 is operated at least from time to time and the radiation emitted by the semiconductor chip 1 is detected for instance by means of a detector according to FIG. 4C. In contrast to the roughening according to FIG. 1, for instance, the roughened portion 5 according to FIGS. 4C and 5 does not pass completely through the conversion layers 4. Electrical operation of the semiconductor chip 1 thus enables the color location of the resultant mixed radiation R to be purposefully adjusted during creation of the roughening.

It is optionally possible for a carrier 9, not shown in FIG. 5, to be mounted, for instance, between the electrical contacts 11 and the semiconductor layer sequence 2.

In the example according to FIG. 6, the semiconductor chip 1 comprises two different semiconductor layer sequences 2a, 2b, which are preferably produced epitaxially independently of one another. The semiconductor layer 2a here comprises the at least one active layer 3, while the semiconductor layer 2b comprises the conversion layers 4. The two semiconductor layers 2a, 2b are connected to one another at a joint plane 13, for example, by wafer bonding. The joint is preferably achieved without connecting means.

The example of the semiconductor chip 1 according to FIG. 7 also comprises two different semiconductor layer sequences 2a, 2b. The semiconductor layer sequences 2a, 2b are joined together permanently and mechanically fixedly by a connecting means 14. The refractive index is, for example, adapted by the connecting means 14, such that the primary radiation P generated in the at least one active layer 3 may arrive efficiently at the conversion layers 4. The connecting means 14 is, for example, a silicone or a silicone-epoxy hybrid material.

Figure 8:
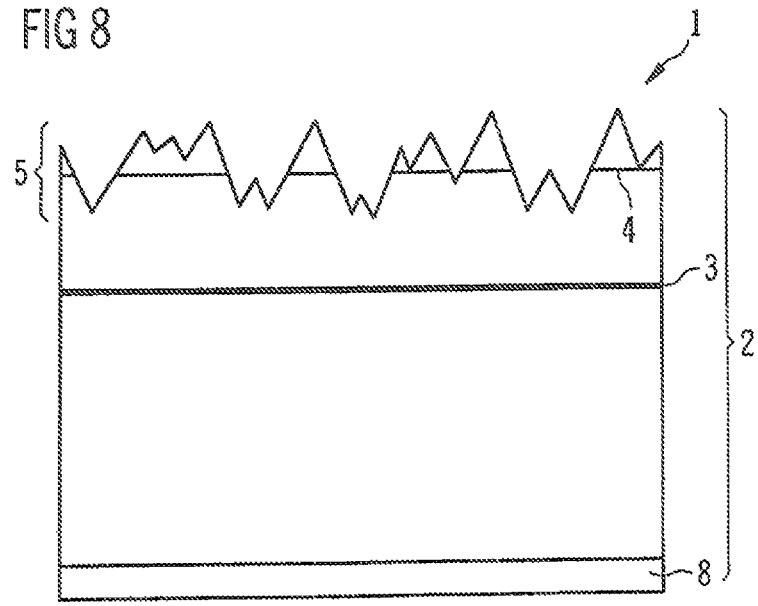

In the example according to FIG. 8 the semiconductor chip 1 has only precisely one conversion layer 4. The thickness of the conversion layer 4 exceeds 10 nm or 14 nm, for example. The roughened portion 5 additionally passes fully through the conversion layer 4 in places. The semiconductor layer sequence 2 may be mechanically self-supporting and have no further carrier. The mirror 8, which may consist of several layers and which may also serve in electrical contacting of the semiconductor chip 1, is optionally mounted on a bottom of the semiconductor layer sequence 2 remote from the roughening. The mirror 8 may also be mechanically stabilized by the semiconductor chip 1, if the mirror 8 is formed, for example, by a metal layer with a thickness of, for example, at least 20 μm.

Figure 9:
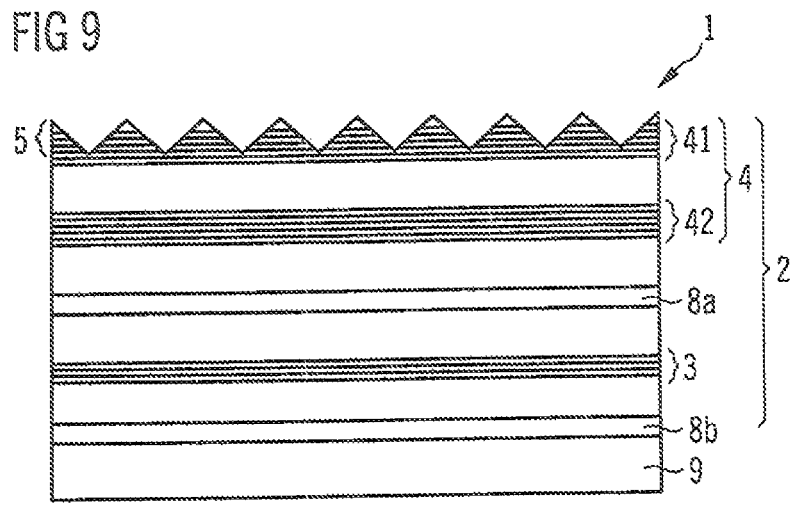

The semiconductor chip 1 according to FIG. 9 comprises two groups 41, 42 of conversion layers 4. The groups 41, 42 are spaced spatially from one another when viewed in the direction of growth of the semiconductor layer sequence 2. The roughened portion 5 does not here extend right into the group 42 located closer to the plurality of active layers 3. Red light from the primary radiation may, for example, be generated by the group 41 and yellow light by the group 42.

The mirror 8a is preferably located between the groups 41, 42 and the active layers 3, which has a transmissive action with regard to the primary radiation and a reflective action with regard to the secondary radiation. The mirror 8a is a Bragg mirror, for example. The further mirror 8b is optionally located between the semiconductor layer sequence 2 and the carrier 9.

Figure 10:
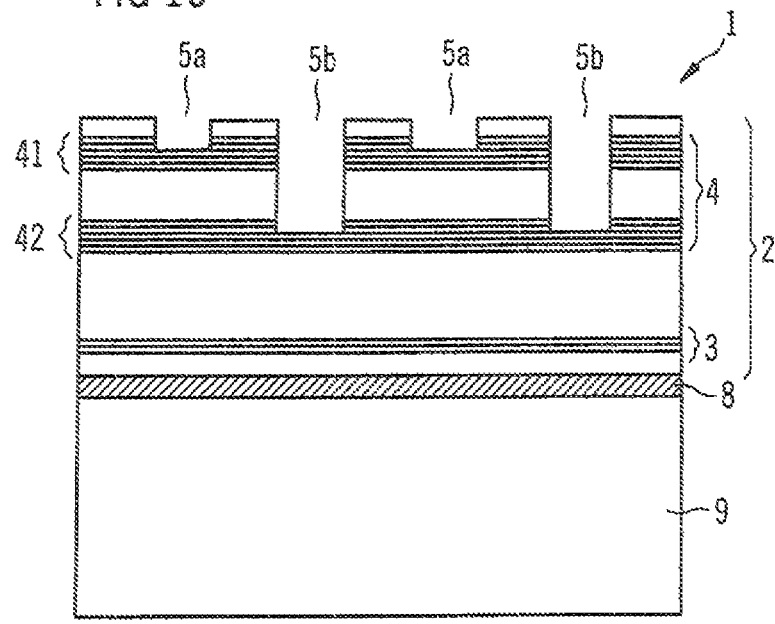

In the example of the semiconductor chip 1 according to FIG. 10, roughened portion 5a, 5b of different depths is produced, for example, by way of dry-chemical etching in conjunction with an appropriately patterned mask, optionally followed by wet-chemical etching. The roughened portion 5a extends only into conversion layer 41, which is further away from the active layer 3. The roughened portion 5b passes completely through the conversion layer 41 and extends into the conversion layer 42 located closer to the active layer 3. Unlike what is shown in FIG. 10, the areas of roughened portion 5a, 5b may also be not only alternating but also arranged in blocks or in sections.

Figure 11:
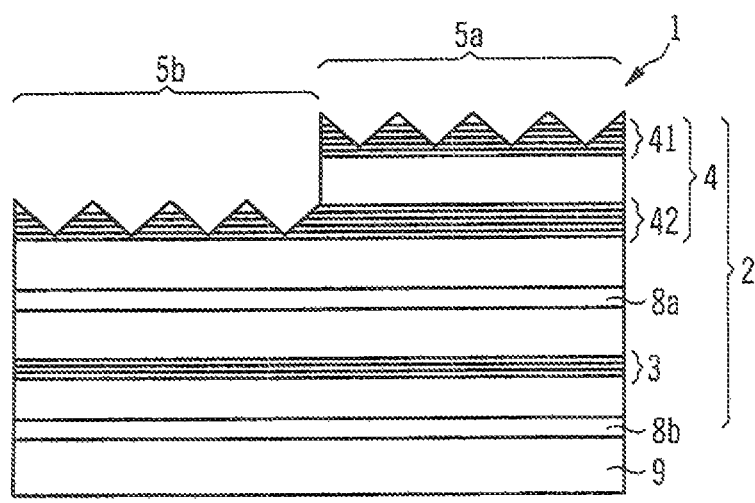

According to FIG. 11 the conversion layer 41 is completely removed in the region of the roughened portion 5b. Unlike what is shown in the illustration, it is also possible for the roughened portion 5a to extend into the conversion layer 42. The areas with the different degrees of roughened portion 5a, 5b, in particular, emit light in different colors when the semiconductor chip 1 is in operation.

In the examples of the semiconductor chip 1, in particular, according to FIGS. 10 and 11, it is possible for light of different colors, for example, cool white, warm white, red, green and/or blue light, to be emitted in different emission regions, which preferably exhibit different degrees of roughened portion 5a, 5b and which preferably extend in each case over a plurality of the roughened portion 5a, 5b pattern elements. It is likewise possible for the emission regions emitting in different colors to be individually and mutually independently electrically drivable, such that, for example, an "RGB" light-emitting diode and/or a light-emitting diode with an adjustable color temperature may be obtained by a single, in particular, continuously epitaxially grown semiconductor body.

The average lateral extension of the emission regions emitting light with different color locations is, for example, 5 μm to 1 mm, in particular 10 μm to 200 μm. It is possible for the semiconductor chip 1 in each case to comprise a plurality of emission regions, which emit light with, within the bounds of manufacturing tolerances, the same color location and which may be combined into electrically jointly drivable groups.

The chips and methods described herein are not restricted by the description given with reference to the examples. Rather, the invention disclosure encompasses any novel feature and any combination of features, including in particular any combination of features in the appended claims, even if the feature or combination is not itself explicitly indicated in the claims or examples.

The invention claimed is:

1. A method of producing an optoelectronic semiconductor chip comprising:
   providing a growth substrate;
   growing a semiconductor layer sequence epitaxially on the growth substrate, the semiconductor layer sequence comprising at least one active layer that generates primary radiation and a plurality of conversion layers which at least in part absorb the primary radiation and convert it into secondary radiation of a longer wavelength than the primary radiation;
   forming a roughened portion which extends at least into one of the conversion layers, the material of at least one conversion layer being removed in places by roughening; and
   completing the semiconductor chip,
   wherein a color location of radiation emitted by the semiconductor chip is altered by the roughening,
   wherein the roughened portion is of a random structure,
   the semiconductor layer sequence is formed by a single layer sequence grown as a whole and which comprises both the at least one active layer and the conversion layers which are monolithically integrated in the semiconductor layer sequence, and
   the semiconductor layer sequence emits radiation at least temporarily during creation of the roughened portion and the color location of the radiation emitted by the semiconductor layer sequence is measured at least temporarily.

2. The method according to claim 1, wherein a sum of a $c_x$ value and a $c_y$ value of the color location of the radiation emitted by the semiconductor chip is reduced in a CIE standard chromaticity diagram by at least 0.05 units during roughening.

3. The method according to claim 1, wherein the growth substrate is removed from the semiconductor layer sequence before roughening, the semiconductor chip is electrically contacted before the roughening, and the semiconductor chip is electrically operated periodically during roughening.

* * * * *